(12) United States Patent
Livshits et al.

(10) Patent No.: US 6,350,391 B1
(45) Date of Patent: Feb. 26, 2002

(54) LASER STRIPPING IMPROVEMENT BY MODIFIED GAS COMPOSITION

(75) Inventors: Boris Livshits, Carmiel; Menachem Genut, Haifa; Ofer Tehar-Zahav, Natania, all of (IL)

(73) Assignee: Oramir Semiconductor Equipment Ltd., Haifa (IL)

( * ) Notice: Subject to any disclaimer, the term of this patent is extended or adjusted under 35 U.S.C. 154(b) by 0 days.

(21) Appl. No.: 09/068,061
(22) PCT Filed: Nov. 4, 1996
(86) PCT No.: PCT/IL96/00138
§ 371 Date: Apr. 28, 1998
§ 102(e) Date: Apr. 28, 1998
(87) PCT Pub. No.: WO97/17166
PCT Pub. Date: May 15, 1997

(30) Foreign Application Priority Data

Nov. 9, 1995 (IL) ................................................ 115931

(51) Int. Cl.[7] .................... H01L 21/3105; H01L 21/311
(52) U.S. Cl. ........................... 216/65; 216/67; 438/709; 438/725
(58) Field of Search ..................... 216/65, 67; 430/329; 438/708, 709, 725

(56) References Cited

U.S. PATENT DOCUMENTS

| 4,557,819 A | * | 12/1985 | Meacham et al. ............ 216/67 |
| 4,752,668 A | | 6/1988 | Rosenfield et al. ... 219/121 LH |
| 5,024,968 A | | 6/1991 | Engelsberg ................. 437/173 |
| 5,099,557 A | | 3/1992 | Engelsberg ................. 29/25.01 |
| 5,114,834 A | | 5/1992 | Nachshon ................... 430/329 |
| 5,221,427 A | * | 6/1993 | Koinuma et al. ............. 216/67 |
| 5,648,000 A | * | 7/1997 | Yamazaki et al. ............ 216/67 |

FOREIGN PATENT DOCUMENTS

| EP | 350021 B1 | 5/1993 |
| EP | 661110 A1 | 7/1995 |
| JP | 58-52827 A | 3/1983 |
| JP | 1-4024 A | 1/1989 |
| JP | 3-205822 A | 9/1991 |
| JP | 6-77197 A | 3/1994 |
| WO | WO 89/07335 | 8/1989 |
| WO | WO 93/19888 | 10/1993 |
| WO | WO 94/23854 | 10/1994 |
| WO | WO 95/07152 | 3/1995 |
| WO | WO 96/09128 | 3/1996 |

OTHER PUBLICATIONS

Mucha et al, in Thompson, L., ed. et al "Introduction to Microlithography" 2nd ed., ACS, Washington, D.C. 1994, pp 393–399.*

* cited by examiner

Primary Examiner—Anita Alanko
(74) Attorney, Agent, or Firm—Cowan, Liebowitz & Latman, P.C.; William H. Dippert

(57) ABSTRACT

A method and apparatus for accelerating a laser stripping process carried out in a reactive gas mixture, comprising carrying out the stripping process in the presence of an accelerating effective amount of $N_xO_y$ gas.

5 Claims, 3 Drawing Sheets

LASER STRIPPING IMPROVEMENT BY MODIFIED GAS COMPOSITION

FIELD OF THE INVENTION

The present invention relates to U.V. laser surface treatment methods, particularly to the removal of foreign materials from substrate surfaces. More particularly, the invention relates to an improved chemistry for dry stripping process employing UV-laser radiation and reactive chemistry for the removal of photoresist from semiconductor wafers.

BACKGROUND OF THE INVENTION

In the manufacturing of various products it is necessary to apply a layer of protective material on a surface, which must be removed after a specified manufacturing step has been concluded. An example of such process is the so-called "photolithography" process, which is widely used in the manufacturing of integrated circuits. In this process, a pattern is created on a surface using a layer of protective material illuminated through a mask, and the surface is then treated with a developer which removes material from the unmasked portions of the surface, therefore leaving a predetermined pattern. The surface is then treated by ion implantation or by etching agents, which introduce the implanted species into the unmasked portions of the surface, or removes material from unmasked portions. Once these processes are completed, the role of the protecting mask ends and it must be removed. The process is conventional and well known in the art, and is described, e.g., in R. K. Watts, "Lithography", VLSI Technology, S. M. Sze, ed., McGraw-Hill, N.Y., 1988, Chpt. 4.

Two main photoresist stripping methods exist in the modern VLSI/ULSI (Very/Ultra Large Scale Integration) circuits industry (D. L. Flamm, "Dry PlasmaResist Stripping", Parts 1, 2 and 3; Solid State Technology, August, September and October 1992):

1) Wet stripping which uses acids or organic solvents;
2) Dry stripping, which uses plasma, $O_3$, $O_3/N_2O$ or U.V./$O_3$-based stripping.

Both methods are problematic and far from being complete, especially when taking into consideration the future miniaturization in the VLSI/ULSI industry. The current technology is capable of dealing with devices having feature sizes of about 0.5 $\mu$m, but before the end of the century the expectation is that the workable size of the devices is expected to be reduced to 0.25 $\mu$m. The expected size changes require considerable changes in the manufacturing technology, particularly in the stripping stage. The prior art photoresist stripping techniques described above will be unsuitable for future devices, as explained hereinafter.

Utilizing only the wet stripping method is not a perfect solution, as it cannot completely strip photoresist after tough processes that change the chemical and physical properties of the photoresist in a way that it makes its removal very difficult. Such processes include, e.g., High Dose Implantation (HDI), reactive Ion Etching (RIE), deep U.V. curing and high temperatures post-bake. After HDI or RIE the side walls of the implanted patterns or of the etched walls are the most difficult to remove.

In addition, the wet method has some other problems: the strength of stripping solution changes with time, the accumulated contamination in solution can be a source of particles which adversely affect the performance of the wafer, the corrosive and toxic content of stripping chemicals imposes high handling and disposal costs, and liquid phase surface tension and mass transport tend to make photoresist removal uneven and difficult.

The dry method also suffers from some major drawbacks, especially from metallic and particulate contamination, damage due to plasma: charges, currents, electric fields and plasma-induced U.V. radiation, as well as temperature-induced damage, and, last but not least, from incomplete removal. During various fabrication stages, as discussed above, the photoresist undergoes chemical and physical changes which harden it, and this makes the stripping processes of the prior art extremely difficult to carry out. Usually a plurality of sequential steps, involving wet and dry processes are needed to remove completely the photoresist.

The art has addressed this problem in many ways, and commercial photoresist dry removal apparatus is available, which uses different technologies. For instance, UV ozone ashers are sold, e.g. by Hitachi, Japan (UA-3150A), dry chemical ashers are also available, e.g., by Fusion Semiconductor Systems, U.S.A., which utilize nitrous oxide and ozone to remove the photoresist by chemical ashing at elevated temperatures, microwave plasma ashing is also effected, e.g., as in the UNA-200 Asher (ULVAC Japan Ltd.). Also plasma photoresist removal is employed and is commercially available, e.g., as in the Aspen apparatus (Mattson Technology, U.S.A.), and in the AURA 200 (GASONICS IPC, U.S.A.).

More recently, photoresist removal has been achieved by ablation, using laser UV radiation, in an oxydizing environment, as described in U.S. Pat. No. 5,114,834. The ablation process is caused due to strong absorption of the laser pulse energy by the photoresist. The process is a localized ejection of the photoresist layer to the ambient gas, associated with a blast wave due to chemical bonds breaking in the photoresist and instant heating. The partly gasified and partly fragmented photoresist is blown upwards away from the surface, and instantly heats the ambient gas. Fast combustion of the ablation products occurs, due to the blast wave and may also be due to the photochemical reaction of the UV laser radiation and the process gases. The main essence of the process is laser ablation with combustion of the ablated photoresist which occurs in a reactive gas flowing through an irradiation zone. The combination of laser radiation and fast combustion provides simultaneous lowering of the ablation threshold of hard parts of the photoresist (side walls). The combusted ablation products are then removed by vacuum suction, or by gas sweeping leaving a completely clean surface.

While U.S. Pat. No. 5,114,834 provides an important novel process, it still does not provide a high throughput, which is industrially convenient, viz., an industrially acceptable number of wafers that can be stripped during a given time. The laser stripping throughput is determined by the stripping rate or by the number of laser pulses needed for providing complete stripping of a unit area of the photoresist per unit of time.

While reference will be made throughout this specification to the ablation of photoresist from semiconductor wafers, this will be done for the sake of simplicity, and because it represents a well known and widely approached problem. It should be understood, however, that the invention described hereinafter is by no means limited to the stripping of photoresist from wafers, but it applies, mutatis mutandis, to many other applications, such as stripping and cleaning of photoresist from Flat Panel Displays (FPD) or removal of residues from different objects, such as lenses, semiconductor wafers, or photomasks.

SUMMARY OF THE INVENTION

It has now surprisingly been found, and this is an object of the invention, that it is possible to accelerate a given laser removal process by reducing the number of pulses while carrying out the stripping process in the presence of a specific gas composition consisting of $O_2/O_3$ and $N_xO_y$, wherein $N_xO_y$ indicates one or more nitrogen oxides, x and y having the appropriate values for the given oxide or mixtures of oxides.

Four different gas compositions are preferred according to the present invention:

1) $O_2:O_3$ (Comparative)
2) $O_2/O_3:N_xO_y$
3) $O_2:N_xO_y$
4) $N_xO_y$

This surprising result is obtained by providing additive amounts of $N_xO_y$ gases in the reactive gas stream which oxidizes the ablated photoresist and enhances laser etching of hard side-walls. The effect of $N_xO_y$ is significant, since contents of less than 5% of the total gas flow are capable of doubling the stripping throughput. Gas percentages given herein are given by volume, unless otherwise specified.

DETAILED DESCRIPTION OF THE INVENTION

The method of improving the throughput of stripped substrates in an laser stripping process, according to the invention, comprises adding to the reactive gas mixture an accelerating effective amount of one or more gases of the formula $N_xO_y$, wherein x and y have the appropriate values for the given oxide or mixture of oxides, to reduce the number of pulses needed for a complete removal. Typically, $N_xO_y$ comprises a gas selected from the group consisting of NO, $N_2$, $N_2O_3$, $N_2O_4$, $NO_3$ and $NO_4$.

As will be appreciated by the skilled person, $N_xO_y$ can be generated by a number of methods. According to a preferred embodiment of the invention, $N_xO_y$ is generated by exciting $N_2O$ gas. A simple and effective method of exciting $N_2O$ gas is by silent or corona discharge.

The process is schematically illustrated in FIG. 1. Oxygen is excited in a first corona discharge ozone generator indicated by numeral 1, to produce a mixture of $O_2$ and $O_3$, in proportions depending on the discharged energy in the generator. $N_2O$ is excited in a second corona discharge device indicated by numeral 2, to produce a mixture of NO, $NO_2$ and $N_2O$ gases ($N_xO_y$). The $N_xO_y$, $O_2$ and $O_3$ are fed to the process chamber (numeral 3). In the process chamber the wafer which is swept by the aforementioned reactive gases is irradiated by U.V. Laser radiation 4, and stripping takes place. The gases passing through the chamber are exhausted through the vent 5.

As stated, even very low amounts of $N_xO_y$ are useful in effectively reducing the number of pulses needed to completely remove the film. According to a preferred embodiment of the invention the content of $N_xO_y$ in the total reactive gas stream varies according to the pressure in the process chamber. Typical pressures are in the range of 0.1–2 bar, preferably 0.3–0.99 bar. For example, at ~0.4 bar the optimum content of excited $N_2O$ is ~5% (v/v) (See FIG. 2). As will be appreciated by the skilled person, the optimal content of $N_xO_y$ will vary as a function of many operating conditions, such as the laser pulse energy fluence, the pulse repetition rate, the laser wavelength, the laser beam incidence angle, the height of the optical window above the wafer surface, the total pressure in the process chamber, the substrate temperature, the scanning velocity of the laser beam footprint, the flow velocity of the reactive gas mixture, as well as the partial pressures of reactive gas mixture components. These parameters will have to be determined specifically for specific stripping tasks. Determination of the optimal $O2/O3:N_xO_y$ ratio, however, can be easily carried out by the skilled person for a given system, and does not impose an excessive burden on the planning of operating conditions. The optimal operating conditions may be determined, for example, by using statistical optimization software.

Without wishing to be bound by any particular theory, the inventors believe that the surprising results achieved by the invention are due to the processes illustrated in the "Reaction Scheme" in FIG. 3.

Other gases may be added to the $O_2/O_3:N_xO_y$ gas composition to improve the removal, especially of inorganic residues. Such gases must include chlorine and/or fluorine atoms, e.g., $Cl_2$, $F_2$, $NF_3$, NOCl, NOF, $Cl_2O$, $ClO_2$, $CF_4$, $CClF_3$, HCl, HF, $SF_4$ and $SF_6$.

The invention also encompasses the apparatus for carrying out the laser stripping of a coated or contaminated surface according to the invention. Such apparatus comprises:

a laser U.V. radiation source;

a process chamber suitable to contain the surface to be stripped, said chamber being provided with gas inlet(s) and gas outlet(s);

at least one source of oxygen or of ozone; and at least one source of $N_xO_y$.

The above and other characteristics and advantages of the invention will be better understood through the following illustrative and non-limitative examples.

BRIEF DESCRIPTION OF THE DRAWINGS

In the drawings:

FIG. 2 is an example of the effect of excited $N_2O$ addition at 365 mbar; In FIG. 2A, the abscissa is the percent of $N_2O$ added and the ordinate is the number of pulses. In FIG. 2B, the axes X, Y have the same meanings as in FIG. 2A and the Z-axis is the response as defined above.

EXAMPLE 1 (COMPARATIVE)

A 6" wafer covered with a layer of patterned, novolak type, positive 1.2 μm thick photoresist (high dose implanted: dose of $5\times10^{15}$ atom/cm$^2$ and energy of 80 Kev) was treated in a process chamber comprising:

a base provided with object support means;

a cover provided with a window substantially transmissive of laser light;

gas inlet and gas outlet means;

the said cover and the said base, when connected, leaving a space between the surface of the element and the inner surface of the window, in which gases flowing through the said gas inlet may flow above the surface of the object being treated and out of the cell through the said gas outlet. Such a chamber is described and claimed in copending Israeli patent application No. 115934 of the same applicant herein. The chamber was equipped with a quartz window for UV light passage, gas inlet and outlet, and optics to deliver the laser beam at a predetermined position. The process was operated according to U.S. Pat. No. 5,114,834, using ozone as the reactive gas. The pressure in the chamber was maintained at 365 mbar. The laser employed was a Lambda Physik LPX315IMC excimer laser. Complete removal was obtained using over 120 pulses. The complete removal was verified by several analytical techniques, such as Auger Electron Spectroscopy (AES), Scanning Electron Microscopy (SEM), Total Reflection X-Ray Fluorescence (TXRF) and Atomic Absorption Spectroscopy (AAS).

EXAMPLE 2

Figure 1:
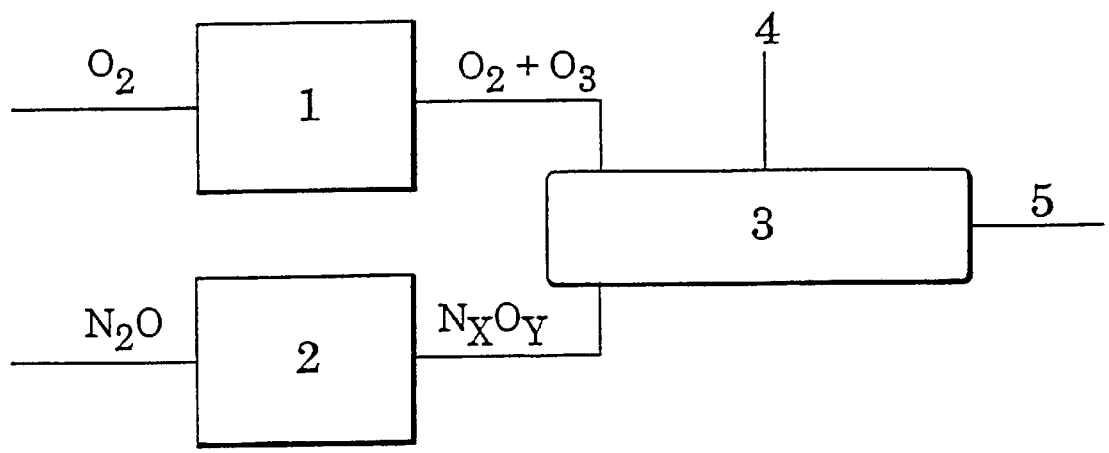
FIG. 1 schematically illustrates the process chamber and gases inflow.

Operating as in Example 1, but with the addition of $N_2O$, through the corona discharge arrangement shown in FIG. 1, various amounts of $N_2O$ were tested, and it was found that adding 5 vol. % of $N_2O$ leads to an optimal pulse reduction, to 58 pulses (instead of over 120), for the same removal quality.

Figure 2A:
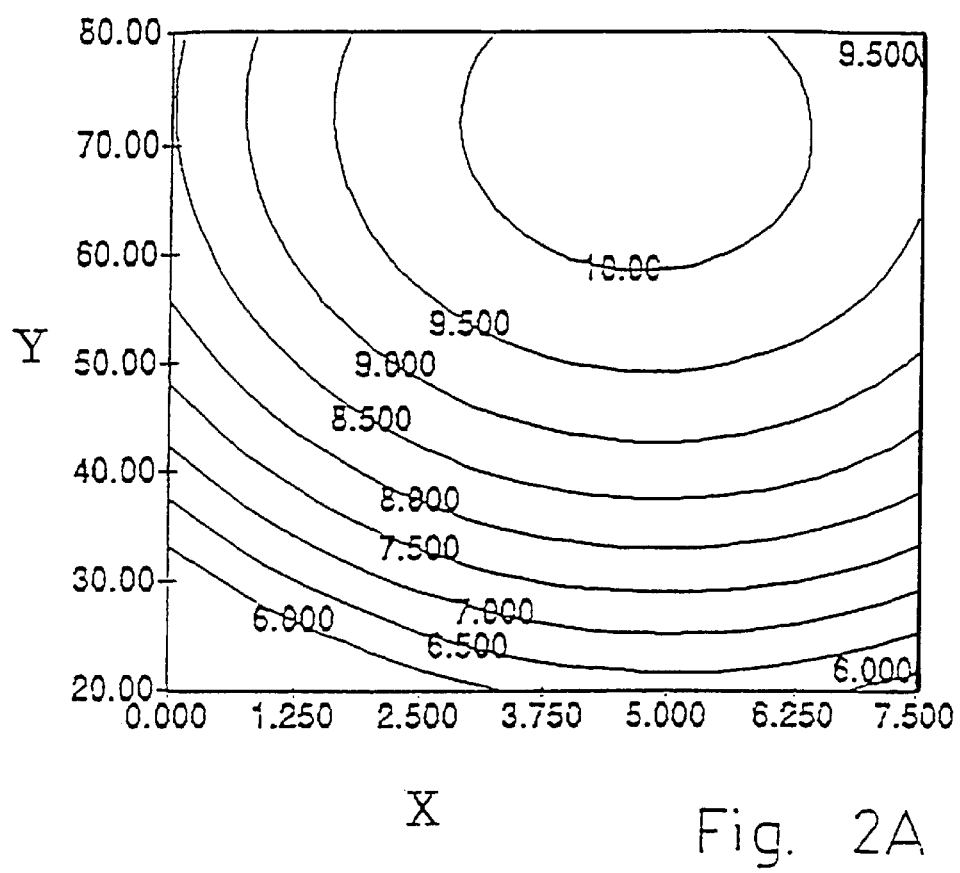
FIG. 2A is a 2-dimensional plot and FIG. 2B is a 3-dimensional plot. These FIGURES show the response, which indicates the degree of removal of photoresist on an arbitrary scale of 0 to 10, wherein 10 indicates complete removal and 0 indicates no removal, as a two variable function.
Figure 2B:
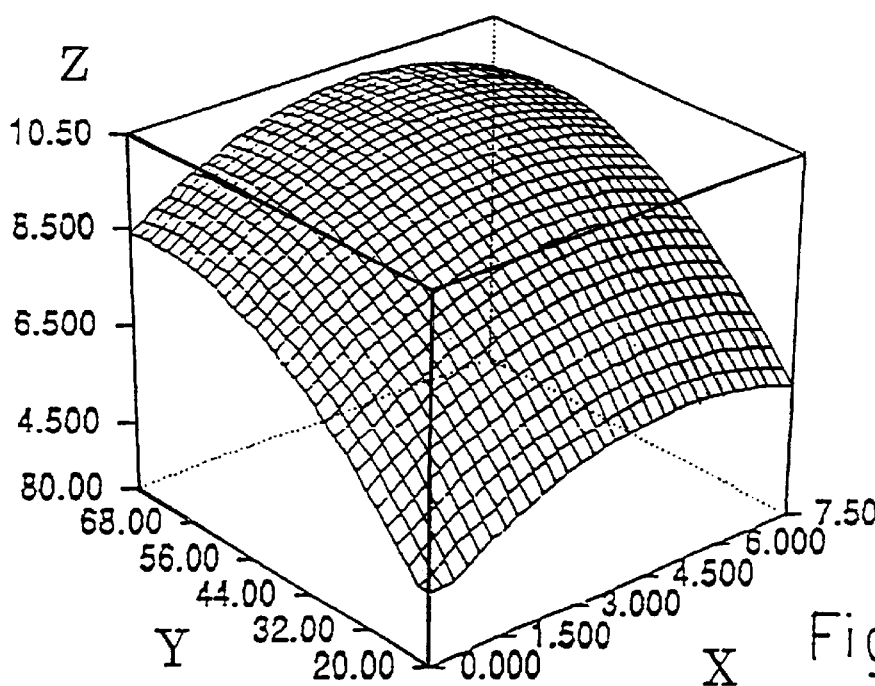
Figure 3:
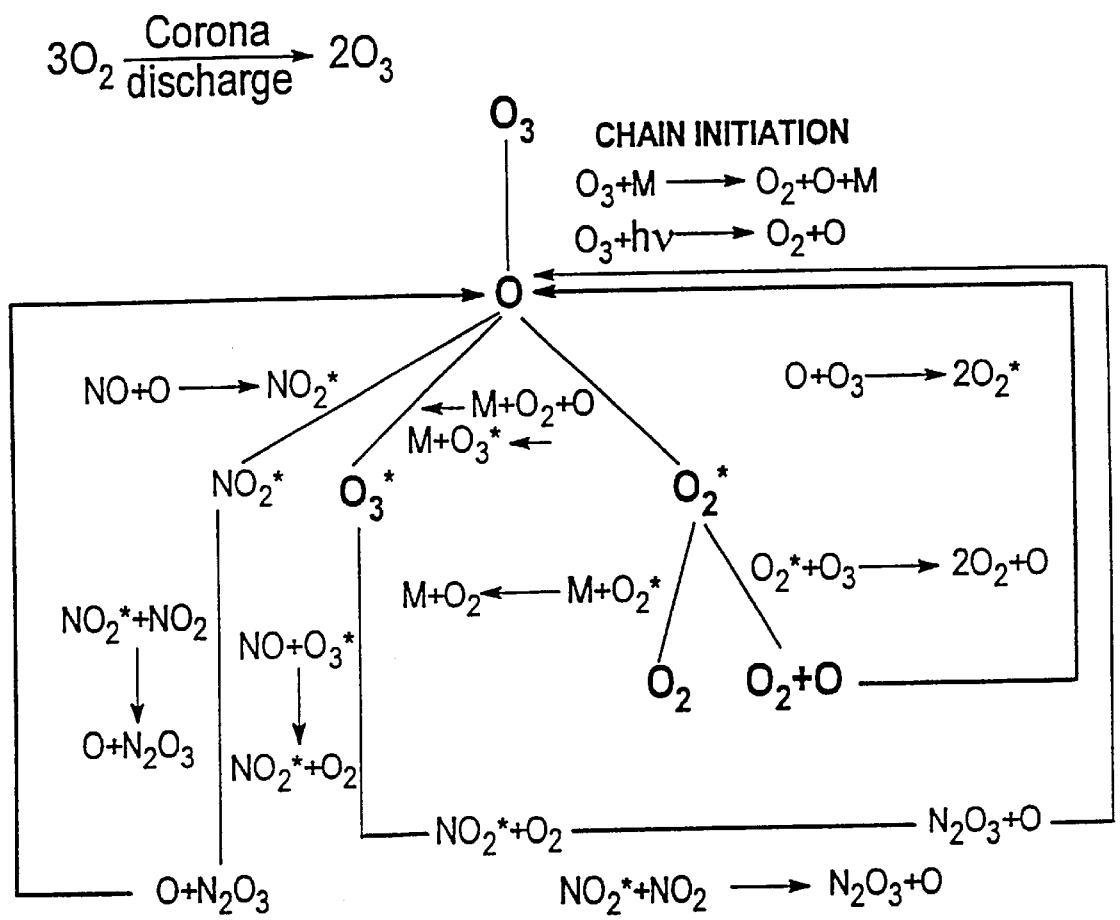
FIG. 3 illustrates the "reaction scheme".

From a number of experiments results were obtained which, by interpolation, lead to the results shown in FIG. 2. FIG. 2A shows, in planar form, the same results shown in 3D form in FIG. 2B.

The actual gain obtained when $N_2O$ is introduced into the gas mixture can better be understood from FIG. 2A. This will be illustrated with reference to the response marked 8.5. It can be seen that, without introduction of $N_2O$ (y; $N_2O=0$), about 75 pulses are needed to reach 85% removal. However, when 5% (v/v) of $N_2O$ was introduced into the process chamber, the number of pulses required to obtain the same removal quality was dramatically reduced to 37. This means that a double number of wafers can be stripped in a given period of time. Complete removal was checked also in this case, as described with reference to Example 1.

EXAMPLE 3

Operating as in Example 2, but the photoresist passed RIE as in the case of metal, polysilicon or via etch, comparable results were obtained.

EXAMPLE 4

Operating as in Example 2, a hard-baked photoresist was used which was obtained by hard baking it at 240° C. and deep UV curing after the developing stage. About half of the pulses were needed when the $N_2O$ gas was introduced, as compared to the operation without it.

EXAMPLE 5

Operating as in Example 2, but with the addition of NO gas (instead of excited $N_2O$), about half of the pulses were needed in comparison to Example 1.

EXAMPLE 6

Operating as in Example 2, but with the addition of NO gas (instead of excited $N_2O$), and using oxygen (instead of ozone), about half of the pulses were needed, in comparison to Example 1.

All the above description and examples have been given for the purpose of illustration only, and are not intended to limit the invention in any way. Many modifications can be effected in the method of the invention. For instance, the optimal conditions, as well as the $N_2O$ content may vary with most of the operating parameters. Additionally, the gases may be excited in different ways, or other gases can be added in addition to or without the $N_2O$ required for $N_xO_y$ formation. In particular, NO and $NO_2$ can be added to the gas mixture containing ozone and/or oxygen, as well as NO or $NO_2$ alone all without exceeding the scope of the invention.

What is claimed is:

1. A method of stripping photoresists from wafers, comprising the steps of:
   (a) providing a process chamber containing a wafer from which photoresists are to be stripped;
   (b) subjecting a stream of oxygen to corona discharge to produce a stream of a mixture of oxygen and ozone;
   (c) concurrently and separately subjecting a stream of nitrous oxide to corona discharge to produce a stream of a mixture of nitrogen oxides;
   (d) passing said two streams of mixtures together to said process chamber whereby said wafer contacts them;
   (e) concurrently irradiating said wafer by a pulsed UV laser beam; and
   (f) discharging said stream of mixtures from said chamber.

2. A method according to claim 1, wherein the pulsed laser beam in step (e) has a number of pulses of not more than about 60 pulses.

3. A method according to claim 1, wherein the irradiation of the wafer in step (e) is carried out under a pressure from 0.1 to 2.00 bar.

4. A method according to claim 1, wherein in step (d) the stream of nitrous oxide is in the amount of 5 vol % of the stream of oxygen.

5. A method according to claim 1, further comprising the step of supplying to the process chamber a gas including chlorine and/or fluorine atoms.

* * * * *